United States Patent
Shao et al.

(10) Patent No.: US 11,300,875 B2
(45) Date of Patent: Apr. 12, 2022

(54) PHOTORESIST, DISPLAY PANEL AND DISPLAY DEVICE

(71) Applicant: TCL CHINA STAR OPTOELECTRONICS TECHNOLOGY CO., LTD., Guangdong (CN)

(72) Inventors: Yuan Shao, Guangdong (CN); Hsiaohsien Chen, Guangdong (CN); Chunqiu Yan, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 199 days.

(21) Appl. No.: 16/765,174

(22) PCT Filed: Apr. 29, 2020

(86) PCT No.: PCT/CN2020/087730
§ 371 (c)(1),
(2) Date: May 19, 2020

(87) PCT Pub. No.: WO2021/208148
PCT Pub. Date: Oct. 21, 2021

(65) Prior Publication Data
US 2021/0325779 A1    Oct. 21, 2021

(30) Foreign Application Priority Data
Apr. 15, 2020  (CN) .......................... 202010296453.9

(51) Int. Cl.
*G02F 1/1335* (2006.01)
*G03F 7/00* (2006.01)
(Continued)

(52) U.S. Cl.
CPC .............. *G03F 7/0007* (2013.01); *B32B 7/12* (2013.01); *B32B 27/06* (2013.01); *G02F 1/1339* (2013.01);
(Continued)

(58) Field of Classification Search
CPC ................................................ G02F 1/133516
See application file for complete search history.

(56) References Cited

U.S. PATENT DOCUMENTS

2010/0159404 A1* 6/2010 Hatakeyama ............. G03F 7/40
430/326
2014/0168589 A1  6/2014 Miyake
(Continued)

FOREIGN PATENT DOCUMENTS

CN       103765305 A    4/2014
CN       105190440 A    12/2015
(Continued)

*Primary Examiner* — Edmond C Lau
(74) *Attorney, Agent, or Firm* — Mark M. Friedman

(57) ABSTRACT

The present application provides a photoresist, a display panel, and a display device. The photoresist is with a photosensitive polymerizable compound, wherein under irradiation of light of a first wavelength, the photosensitive polymerizable compound behaves as a hydrophilic polymerizable compound, and under irradiation of light of a second wavelength, the photosensitive polymerizable compound behaves as a hydrophobic polymerizable compound.

20 Claims, 4 Drawing Sheets

(51) Int. Cl.
*G02F 1/1339* (2006.01)
*G02F 1/1362* (2006.01)
*B32B 27/06* (2006.01)
*G03F 7/032* (2006.01)
*B32B 7/12* (2006.01)
*G02F 1/1333* (2006.01)

(52) U.S. Cl.
CPC ...... *G02F 1/1362* (2013.01); *G02F 1/133512* (2013.01); *G02F 1/133516* (2013.01); *G03F 7/032* (2013.01); *B32B 2457/202* (2013.01); *G02F 1/133357* (2021.01); *G02F 1/136222* (2021.01); *G02F 2202/28* (2013.01)

(56) References Cited

U.S. PATENT DOCUMENTS

| | | |
|---|---|---|
| 2018/0107054 A1 | 4/2018 | He |
| 2020/0165519 A1 | 5/2020 | Inui et al. |

FOREIGN PATENT DOCUMENTS

| | | |
|---|---|---|
| CN | 105467663 A | 4/2016 |
| CN | 105717695 A | 6/2016 |
| CN | 107229152 A | 10/2017 |
| CN | 109841734 A | 6/2019 |
| CN | 110720064 A | 1/2020 |

\* cited by examiner

| providing a substrate, coating a photoresist on the substrate to form a photoresist layer. | S1 |

| irradiating the photoresist layer under irradiation. | S2 |

| exposing and developing the photoresist layer to obtain a black matrix and a color resist layer. | S3 |

```
┌─────────────────────────────────────────────────────────────┐
│ providing a substrate to be coated, and coating a photoresist of a │
│ first color on the substrate to form a color resist layer of the first │ ─S201
│ color.                                                      │
└─────────────────────────────────────────────────────────────┘

┌─────────────────────────────────────────────────────────────┐
│ irradiating the photoresist layer of the first color under irradiation. │ ─S202
└─────────────────────────────────────────────────────────────┘

┌─────────────────────────────────────────────────────────────┐
│ exposing and developing the color resist layer of the first color to │ ─S203
│ obtain a resist block of the first color.                   │
└─────────────────────────────────────────────────────────────┘

┌─────────────────────────────────────────────────────────────┐
│ applying a photoresist layer of the second color on the substrate │
│ formed with the resist block of the first color to form a resist layer │ ─S204
│ of the second color.                                        │
└─────────────────────────────────────────────────────────────┘

┌─────────────────────────────────────────────────────────────┐
│ irradiating the resist layer of the second color under irradiation. │ ─S205
└─────────────────────────────────────────────────────────────┘

┌─────────────────────────────────────────────────────────────┐
│ exposing and developing the color resist layer of the second color to │ ─S206
│ obtain a color resist block of a second color.              │
└─────────────────────────────────────────────────────────────┘

┌─────────────────────────────────────────────────────────────┐
│ applying a photoresist of a third color on the substrate formed with │
│ the color resist block of the second color to form a color resist layer │ ─S207
│ of the third color.                                         │
└─────────────────────────────────────────────────────────────┘

┌─────────────────────────────────────────────────────────────┐
│ irradiating the resist layer of the third color under irradiation. │ ─S208
└─────────────────────────────────────────────────────────────┘

┌─────────────────────────────────────────────────────────────┐
│ exposing and developing the color resist layer of the third color to │ ─S209
│ obtain a color resist block of the third color.             │
└─────────────────────────────────────────────────────────────┘
```

FIG. 5

PHOTORESIST, DISPLAY PANEL AND DISPLAY DEVICE

BACKGROUND OF INVENTION

Field of Invention

The present application relates to a field of display, in particular, to a photoresist, a display panel, and a display device.

Description of Prior Art

In a manufacturing process of an LCD panel, a black matrix, a pixel layer, a frame glue, a support pillar, etc. are all irradiated by photolithography with a photoresist. However, with the increasing size of the panel, requirements for the thickness and uniformity of material in the panel are becoming higher and higher, which requires great leveling of photoresist layer material.

However, to increase the leveling of the photoresist layer material, it is necessary to add a solvent to enhance the hydrophilicity of the photoresist, so that a force between the photoresist and the panel is reduced, making the photoresist easier to be removed by a developer during the etching process, which increases risk of peeling between layers of the display panel. However, enhancing the hydrophobicity of the photoresist will result in ab excessive force between the photoresist and the panel and increase the difficulty of stripping the photoresist.

Therefore, in the prior art, during the stripping process of the photoresist, the risk of stripping is likely to occur between the layers of the display panel, and there is a problem that the photoresist remains.

SUMMARY OF INVENTION

Embodiments of the present application provide a photoresist, a display panel, and a display device, which can effectively alleviate the technical problem of the prior art that during the stripping process of the photoresist, the risk of stripping is likely to occur between the layers of the display panel, and there is a problem that the photoresist remains.

In a first aspect, an embodiment of the present application provides a photoresist, added with a photosensitive polymerizable compound, wherein under irradiation of light of a first wavelength, the photosensitive polymerizable compound behaves as a hydrophilic polymerizable compound, and under irradiation of light of a second wavelength, the photosensitive polymerizable compound behaves as a hydrophobic polymerizable compound.

In the photoresist provided by the present application, the photosensitive polymerizable compound includes azobenzene.

In the photoresist provided by the present application, the light of the first wavelength is ultraviolet light having a wavelength ranging from 10 nm to 400 nm.

In the photoresist provided by the present application, the light of the second wavelength is visible light having a wavelength ranging from 450 nm to 780 nm.

In the photoresist provided by the present application, the photoresist further includes an organic resin.

In the photoresist provided by the present application, a molecular chain of the organic resin contains a carboxyl functional group.

In the photoresist provided by the present application, a mass ratio of the photosensitive polymerizable compound present in the photoresist is 30% to 70%.

In a second aspect, an embodiment of the present application further provides a display panel, which is prepared using the photoresist described above.

In the display panel provided by the present application, the display panel includes: a color filter substrate arranged opposite to an array substrate, and a liquid crystal cell disposed between the color filter substrate and the array substrate, wherein the color filter substrate and the array substrate are bonded to each other by a frame glue, and wherein the color filter substrate includes a black matrix, a color resist layer, and a support pillar, and at least one of the black matrix, the color resist layer, the support pillar, and the frame glue is prepared using at least one of the above mentioned photoresists.

In the display panel provided by the present application, the display panel includes a color filter substrate arranged opposite to an array substrate, and a liquid crystal cell disposed between the color filter substrate and the array substrate, wherein the color filter substrate and the array substrate are bonded to each other by a frame glue, and wherein the color filter substrate includes a substrate, a black matrix, a planarization layer, a color filter, and a support pillar which are stacked, and the array substrate includes a color resist layer, wherein at least one of the black matrix, the color resist layer, the support pillar, and the frame glue is prepared using at least one of the above mentioned photoresists.

In a third aspect, an embodiment of the present application further provides a display device prepared by using the above-mentioned photoresist, wherein the photoresist is added with the photosensitive polymerizable compound, under irradiation of light of a first wavelength, the photosensitive polymerizable compound behaves as a hydrophilic polymerizable compound, and under irradiation of light of a second wavelength, the photosensitive polymerizable compound behaves as a hydrophobic polymerizable compound.

In the display device provided by the present application, the photosensitive polymerizable compound includes azobenzene.

In the display device provided by the present application, the light of the first wavelength is ultraviolet light having a wavelength ranging from 10 nanometers to 400 nanometers.

In the display device provided by the present application, the light of the second wavelength is visible light having a wavelength ranging from 450 nm to 780 nm.

In the display device provided by the present application, the photoresist further includes an organic resin.

In the display device provided by the present application, a molecular chain of the organic resin contains a carboxyl functional group.

In the display device provided by the present application, a mass ratio of the photosensitive polymerizable compound present in the photoresist is 30% to 70%.

In the display device provided by the present application, the display device includes: a display panel prepared using the photoresist according to claim 1.

In the display device provided by the present application, the display device includes: a color filter substrate arranged opposite to an array substrate, and a liquid crystal cell disposed between the color filter substrate and the array substrate, wherein the color filter substrate and the array substrate are bonded to each other by a frame glue, and wherein the color filter substrate includes a black matrix, a color resist layer, and a support pillar, and at least one of the black matrix, the color resist layer, the support pillar, and the frame glue is prepared using at least one of the above mentioned photoresists.

The present application provides a photoresist, a display panel, and a display device. The photoresist is added with a photosensitive polymerizable compound, wherein under irradiation of light of a first wavelength, the photosensitive polymerizable compound forms a hydrophilic polymerizable compound, and under irradiation of light of a second wavelength, the photosensitive polymerizable compound forms a hydrophobic polymerizable compound. By providing different wavelengths of light to a stripping area and a non-stripping area of the photoresist of the display panel, the hydrophilicity and hydrophobicity of the photoresist in the stripping area and the non-stripping area are converted, thereby increasing efficiency of stripping the photoresist in the display panel manufacturing process.

BRIEF DESCRIPTION OF DRAWINGS

FIG. 5 is a second schematic flowchart of a method of manufacturing a display panel provided by an embodiment of the present application.

DETAILED DESCRIPTION OF PREFERRED EMBODIMENTS

Figure 1:
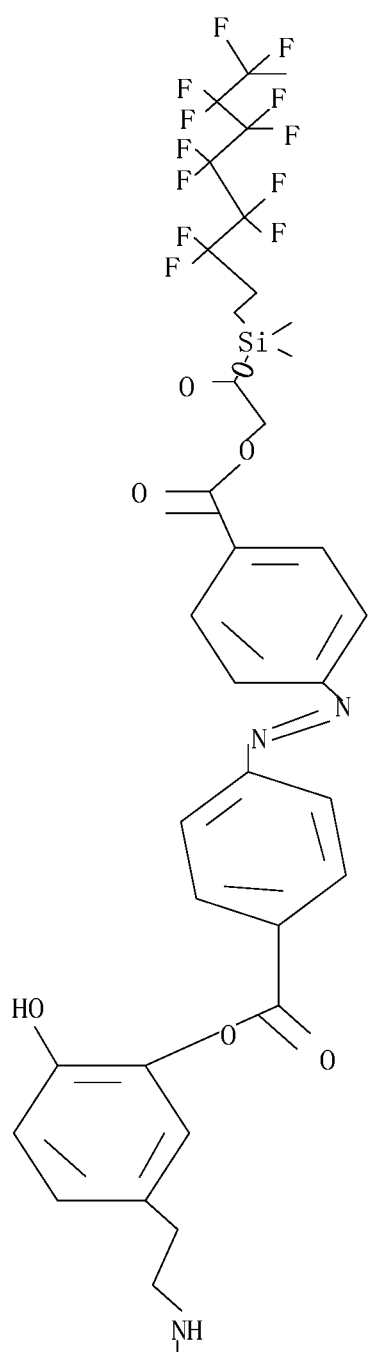
FIG. 1 is a schematic structural diagram of a hydrophilic polymerizable compound provided by an embodiment of the present application.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the description of the present application, it should be understood that the terms "center", "longitudinal", "transverse", "length", "width", "thickness", "upper", "lower", "front", "Rear", "left", "right", "vertical", "horizontal", "top", "bottom", "inside", "outside", "clockwise", "counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In the description of the present application, it should be noted that the terms "installation", "connected", and "connected" should be understood in a broad sense unless explicitly stated and limited otherwise. For example, it can be a fixed connection, a detachable connection, or an integral connection; it can also be a mechanical connection or an electrical connection; it can be a direct connection; or it can be an indirect connection through an intermediate medium; or it can be a communication between two components.

In the present invention, unless otherwise expressly stated and limited, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature. The first feature "below", "under" and "beneath" the second feature includes the first feature directly below and obliquely below the second feature, or merely the first feature has a level lower than the second feature.

The following disclosure provides many different embodiments or examples for implementing different structures of the present invention. In order to simplify the disclosure of the present invention, the components and arrangements of the specific examples are described below. Of course, they are merely examples and are not intended to limit the present invention. In addition, the present invention may repeat reference numerals and/or reference letters in the various embodiments, which are for the purpose of simplicity and clarity, and do not indicate the relationship between the various embodiments and/or arrangements discussed. Moreover, the present invention provides examples of various specific processes and materials, but one of ordinary skill in the art will recognize the use of other processes and/or the use of other materials.

Figure 2:
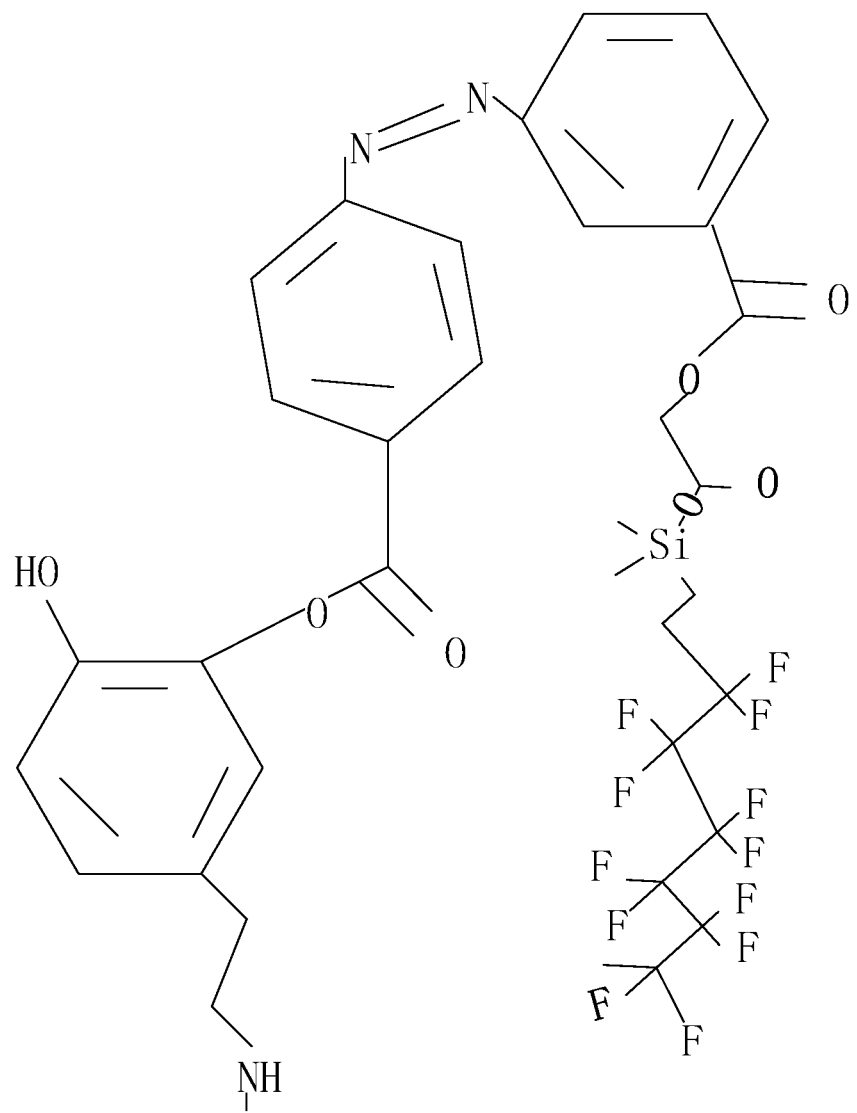
FIG. 2 is a schematic structural diagram of a hydrophobic polymerizable compound provided by an embodiment of the present application.

Specifically, please refer to FIG. 1 to FIG. 2, the present application provides a photoresist, added with a photosensitive polymerizable compound, wherein under irradiation of light of a first wavelength, the photosensitive polymerizable compound behaves as a hydrophilic polymerizable compound, and under irradiation of light of a second wavelength, the photosensitive polymerizable compound behaves as a hydrophobic polymerizable compound. By providing different wavelengths of light to a stripping area and a non-stripping area of the photoresist of the display panel, the hydrophilicity and hydrophobicity of the photoresist in the stripping area and the non-stripping area are converted, thereby increasing efficiency of stripping the photoresist in the display panel manufacturing process.

In some embodiments, the photoresist includes resin, pigment, dispersant, solvent, a photoinitiator, and the like. The resin is a high-molecular polymer, generally an alkaline soluble resin, and its molecular chain usually contains a certain amount of acid groups such as carboxyl groups to ensure that it can react and dissolve with an alkaline developer during the development process. The pigment is a key of the photoresist for showing color, and different photoresists use different pigments. Dispersants are generally divided into two types of high-molecular polymer dispersants and surfactant dispersants, which are used to adsorb on a surface of the pigment and make the pigment evenly distributed in the photoresist. Organic solvents are used to dissolve various polymers, and usually organic solvents with good coating properties such as triethylene glycol methyl ether and the like. The photoinitiator is sensitive to ultraviolet light or visible light, and after absorbing the photon energy, the photoinitiator forms an excited form to initiate a polymerization reaction of monomers and provide a functional group. The photoinitiator used in the present application is azobenzene, and under irradiation, its nitrogen-nitrogen double bond is distorted, such that the the molecular polarity and spatial conformation are converted due to cis-trans isomerization of the azobenzene, so as to trigger a reversible conversion in hydrophilicity/hydrophobicity of the surface of the resin, wherein its surface exhibits hydrophilic properties after 10 minutes of UV exposure, while the photoresist composition exhibits high hydrophobic properties after 20 minutes of further visible light exposure. In the present application, the photosensitive polymerizable compound reacts with the polymer to form a hydrophilic polymerizable compound or a hydrophobic polymerizable compound under different light irradiation conditions, thereby changing a contact angle between the polymer and the substrate, such that the hydrophobicity and hydrophilicity of the polymer are converted.

In some embodiments, the polymer resin is treated with 3-bromopropionic acid and triethylamine to introduce a carboxyl functional group onto its surface, then further modified with dopamine with antibacterial properties, and after that the dopamine hydroxy is used to be grafted with a photosensitive carboxy azophenyl element, followed by modified with 1H, 1H, 2H, 2H-perfluorooctyl trichlorosilane to obtain a photoresist with light responsiveness of low surface energy finally. The azobenzene is used to form a reversible conversion in hydrophilicity/hydrophobicity under ultraviolet light irradiation.

As shown in FIG. 1, under the irradiation of light of the first wavelength, the photosensitive polymerizable compound forms a hydrophilic polymerizable compound, and the hydrophilic polymerizable compound has a smaller contact angle and a smaller interaction force with the substrate, thus easy to strip off. As shown in FIG. 2, under the irradiation of the light of the second wavelength, the photosensitive polymerizable compound forms a hydrophobic polymerizable compound, and the hydrophobic polymerizable compound has a large contact angle, that is, greater than 60 degrees, and a greater interaction force with the substrate. By providing different wavelengths of light to a stripping area and a non-stripping area of the photoresist of the display panel, wherein the photoresist may be the hydrophilic polymerizable compound in the stripping area and has a small force with the substrate, while the photoresist may be the hydrophilic polymerizable compound and has an increased force with the substrate makes, such that the photoresist is easier to be stripped off in the stripping area of the display panel, and difficult to be stripped off in the non-stripping area of the display panel, thereby increasing the stripping efficiency of the photoresist in the display panel process.

In some embodiments, in the irradiation process, the light of the first wavelength is ultraviolet light having a wavelength ranging from 10 nm to 400 nm. Specifically, when the first wavelength is 360 nm to 400 nm, the conversion from the photosensitive polymerizable compound into the hydrophilic polymerizable compound has the highest efficiency.

In some embodiments, in the irradiation process, the light of the first wavelength is visible light having a wavelength ranging from 450 nm to 780 nm. Specifically, when the first wavelength is 450 nm to 600 nm, the conversion from the photosensitive polymerizable compound into the hydrophobic polymerizable compound has the highest efficiency.

In some embodiments, the mass ratio of the photosensitive polymerizable compound in the photoresist is 30% to 70%.

In some embodiments, the photoresist further includes an organic resin, and a molecular chain of the organic resin contains a carboxyl functional group.

Figures 3, 4:
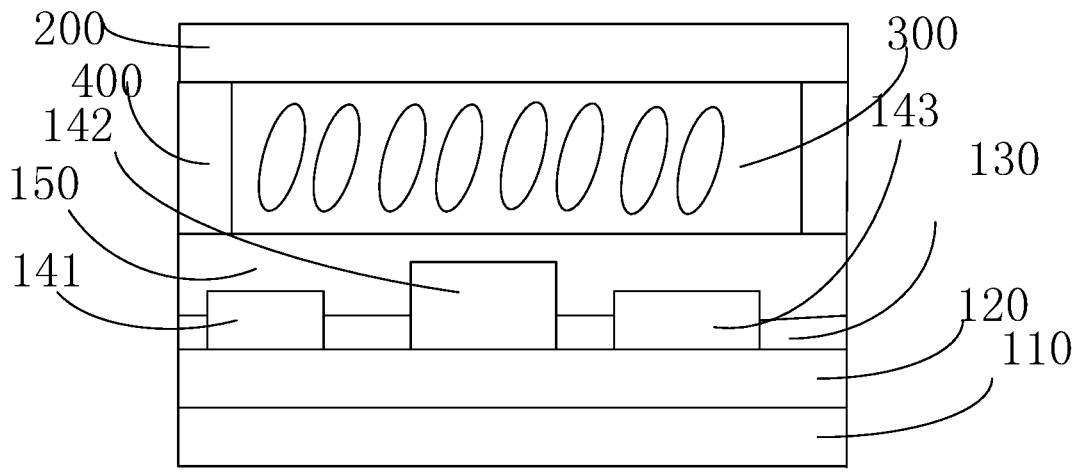
FIG. 3 is a schematic cross-sectional structure diagram of a display panel provided by an embodiment of the present application.
FIG. 4 is a first schematic flowchart of a method of manufacturing a display panel provided by an embodiment of the present application.

As shown in FIG. 3, the present application provides a liquid crystal display panel. The liquid crystal display panel includes: a color filter substrate 100 and an array substrate 200 oppositely disposed, and a liquid crystal cell 300 disposed between the color filter substrate and the array substrate, wherein the color filter substrate and the array substrate are bonded to each other by a frame glue 400, and wherein the color filter substrate includes a substrate 110, an electrode layer 120, a black matrix 130, a color resist layer 140, and a support pillar which are stacked, and at least one of the black matrix 130, the color group layer 140, the support pillar, and the frame glue 400 is prepared by using the above photoresist.

The substrate 110 is usually a transparent substrate, usually made of transparent glass, and the electrode layer 120 is generally made of a transparent conductive material, preferably a metal oxide, such as indium tin oxide, indium zinc oxide, aluminum tin oxide, aluminum zinc oxide, or indium germanium zinc oxide. The black matrix 130 and the color resist layer 140 are formed of the photoresist, and the planarization layer 150 is made of a transparent insulating material.

In some embodiments, the photoresist includes resin, pigment, dispersant, solvent, a photoinitiator, and the like. The resin is a high-molecular polymer, generally an alkaline soluble resin, and its molecular chain usually contains a certain amount of acid groups such as carboxyl groups to ensure that it can react and dissolve with an alkaline developer during the development process. The pigment is a key of the photoresist for showing color, and different photoresists use different pigments. Dispersants are generally divided into two types of high-molecular polymer dispersants and surfactant dispersants, which are used to adsorb on a surface of the pigment and make the pigment evenly distributed in the photoresist. Organic solvents are used to dissolve various polymers, and usually organic solvents with good coating properties such as triethylene glycol methyl ether and the like. The photoinitiator is sensitive to ultraviolet light or visible light, and after absorbing the photon energy, the photoinitiator forms an excited form to initiate a polymerization reaction of monomers and provide a functional group. The photoinitiator used in the present application is azobenzene, and under irradiation, its nitrogen-nitrogen double bond is distorted, such that the the molecular polarity and spatial conformation are converted due to cis-trans isomerization of the azobenzene, so as to trigger a reversible conversion in hydrophilicity/hydrophobicity of the surface of the resin, wherein its surface exhibits hydrophilic properties after 10 minutes of UV exposure, while the photoresist composition exhibits high hydrophobic properties after 20 minutes of further visible light exposure. In the present application, the photosensitive polymerizable compound reacts with the polymer to form a hydrophilic polymerizable compound or a hydrophobic polymerizable compound under different light irradiation conditions, thereby changing a contact angle between the polymer and the substrate, such that the hydrophobicity and hydrophilicity of the polymer are converted.

In some embodiments, the polymer resin is treated with 3-bromopropionic acid and triethylamine to introduce a carboxyl functional group onto its surface, then further modified with dopamine with antibacterial properties, and after that the dopamine hydroxy is used to be grafted with a photosensitive carboxy azophenyl element, followed by modified with 1H, 1H, 2H, 2H-perfluorooctyl trichlorosilane to obtain a photoresist with light responsiveness of low surface energy finally. Based on the reversible conversion in hydrophilicity/hydrophobicity of the azobenzene under ultraviolet light irradiation, the photosensitive polymerizable compound forms a hydrophilic polymerizable compound under ultraviolet light irradiation, and the the photosensitive polymerizable compound forms a hydrophobic polymerizable compound under visible light irradiation. In some embodiments, a mass ratio of the photosensitive polymerizable compound in the photoresist is 30% to 70%.

FIG. 1 shows a hydrophilic polymerizable compound formed from a photosensitive polymerizable compound under irradiation of ultraviolet light, and FIG. 2 shows a hydrophobic polymerizable compound formed from a photosensitive polymerizable compound under irradiation of visible light. When the photoresist is coated on the substrate to be coated to form a photoresist layer, the first photomask is used to irradiate the portion of the photoresist to be stripped with ultraviolet light, and the photosensitive polymerizable compound forms a hydrophilic polymerizable compound. The contact angle formed by the hydrophilic polymerizable compound is small, so the adhesion between the photoresist and the substrate to be coated is reduced in the stripping area, making the photoresist more easily stripped in the stripping area. The portion of the photoresist in the non-stripping area is irradiated with a second light, that is, visible light. Since the photosensitive polymerizable compound in the non-stripping area forms a hydrophobic polymerizable compound, the hydrophobic polymerizable compound has a large contact angle with the substrate, and the force between the photoresist in the non-stripping area and the substrate is increased, so the photoresist in the non-stripping area is not easily stripped off.

In the present application, ultraviolet light and visible light are alternatively used to irradiate the photoresist layer, to greatly increase the adhesion of the photoresist layer to the substrate in the non-stripping area, and to reduce the adhesion of the photoresist layer to the substrate in the stripping area, so that the photoresist in the stripping area is easier to be stripped off, and the photoresist in the non-stripping area is difficult to be stripped off, thereby improving the peeling efficiency of the photoresist.

In some embodiments, the irradiation conditions of the photoresist layer is realized by alternating using ultraviolet light and visible light, the ultraviolet light time is greater than 10 minutes at a time, and the visible light time is greater than 20 minutes.

In some embodiments, the display panel has a color filter on array (COA, RGB) structure, and the support pillar is formed on an array substrate. The array substrate includes a substrate; a pixel circuit, disposed on the substrate. The color filter substrate includes a substrate, a black matrix, a planarization layer, a color filter, and a support pillar which are stacked, and the array substrate includes a color resist layer, wherein at least one of the black matrix, the color resist layer, the support pillar, and the frame glue is prepared using the photoresist described above.

FIG. 4 is a schematic flowchart of a method of manufacturing a display panel provided by an embodiment of the present application.

For the display panel shown in the drawings, the present application provides a method of manufacturing a color filter substrate, including the steps as follows:

Step S1: providing a substrate, coating a photoresist on the substrate to form a photoresist layer.

Step S2: irradiating the photoresist layer under irradiation.

Step S3: exposing and developing the photoresist layer to obtain a black matrix and a color resist layer.

In Step S1, before coating the photoresist, an electrode layer is coated on the substrate to form an electrode, the electrode layer is generally made of a transparent conductive material, preferably a metal oxide, such as indium tin oxide, indium zinc oxide, aluminum tin oxide, aluminum zinc oxide, or indium germanium zinc oxide. The black matrix 130 and the color resist layer 140 are formed of the photoresist, and the planarization layer 150 is made of a transparent insulating material.

In Step S2, the light irradiation is performed on the photoresist layer, a first photomask is provided to irradiate an etching area of the photoresist with ultraviolet light of a first wavelength for a minimum of ten minutes, and the photoresist composition forms a hydrophilic polymerizable compound with a smaller contact angle in the etching area; then, a second photomask is provided to irradiate a patterned area of the photoresist with visible light for a minimum of twenty minutes, and the photoresist layer forms a hydrophobic polymerizable compound with a smaller contact angle in the patterned area.

In some embodiments, in the irradiation process, the light of the first wavelength is ultraviolet light having a wavelength ranging from 10 nm to 400 nm. Specifically, when the first wavelength is 360 nm to 400 nm, the conversion from the photosensitive polymerizable compound into the hydrophilic polymerizable compound has the highest efficiency. The duration of the conversion of the hydrophilic polymerizable compound is very short, basically less than 1 s, such as 0.2 s, 0.4 s, 0.6 s, 0.8 s, or 1 s. In order to obtain a better and stable conversion effect and improve the operating efficiency, the light with a wavelength of 360 nm is used, and the irradiation time is not less than ten minutes.

In some embodiments, in the irradiation process, the light of the first wavelength is visible light having a wavelength ranging from 450 nm to 780 nm. Specifically, when the first wavelength is 450 nm to 600 nm, the conversion from the photosensitive polymerizable compound into the hydrophobic polymerizable compound has the highest efficiency. The duration of the conversion of the hydrophilic polymerizable compound is very short, basically less than 1 s, such as 0.2 s, 0.4 s, 0.6 s, 0.8 s, or 1 s. In order to obtain a better and stable conversion effect, and improve the operating efficiency, the first wavelength of 450 nm light is used. Considering the influence of the irradiation with the first light, the irradiation time of the irradiation with the second light is not less than 20 minutes.

In step S3, for the color resist layer after the irradiation, a half-tone mask is used to etch the photoresist layer, the black matrix 300 is formed in a shielding area, and a color resist layer is formed on the patterned portion of the black matrix 300.

In some embodiments, the added pigment and its added ratio of the photoresist are changed to form the color resist layer 400. The color resist layer 400 includes a red color resist block 141, a blue color resist block 142, and a green color resist block 143, wherein the red color resist block 141 only allows red light to pass, the blue color resist block 142 only allows blue light to pass, and the green color resist block 143 only allows green light to pass through, and the red color resist blocking block 141, the blue color resist blocking block 142, and the green color resist blocking block 143 correspond to one pixel.

As shown in FIG. 5, the steps of applying the color resist layer are as follows:

S201: providing a substrate to be coated, and coating a photoresist of a first color on the substrate to form a color resist layer of the first color.

S202: irradiating the photoresist layer of the first color under irradiation.

S203: exposing and developing the color resist layer of the first color to obtain a resist block of the first color.

S204: applying a photoresist layer of the second color on the substrate formed with the resist block of the first color to form a resist layer of the second color.

S205: irradiating the resist layer of the second color under irradiation.

S206: exposing and developing the color resist layer of the second color to obtain a color resist block of a second color.

S207: applying a photoresist of a third color on the substrate formed with the color resist block of the second color to form a color resist layer of the third color.

S208: irradiating the resist layer of the third color under irradiation.

S209: exposing and developing the color resist layer of the third color to obtain a color resist block of the third color.

In Step S201, before coating the color resist layer, the panel to be coated is formed with a black matrix, and the patterned portion of the black matrix forms the color resist layer.

In Step S202, Step S205, and Step S208, the light irradiation is performed on the photoresist, a first photomask is provided to irradiate an etching area of the photoresist with ultraviolet light of a first wavelength for a minimum of ten minutes, and the photoresist composition forms a hydrophilic polymerizable compound with a smaller contact angle in the etching area; then, a second photomask is provided to irradiate a patterned area of the photoresist with visible light for a minimum of twenty minutes, and the photoresist layer forms a hydrophobic polymerizable compound with a smaller contact angle in the patterned area.

In some embodiments, in the irradiation process, the light of the first wavelength is ultraviolet light having a wavelength ranging from 10 nm to 400 nm. Specifically, when the first wavelength is 360 nm to 400 nm, the conversion from the photosensitive polymerizable compound into the hydrophilic polymerizable compound has the highest efficiency. The duration of the conversion of the hydrophilic polymerizable compound is very short, basically less than 1 s, such as 0.2 s, 0.4 s, 0.6 s, 0.8 s, or 1 s. In order to obtain a better and stable conversion effect and improve the operating efficiency, the light with a wavelength of 360 nm is used, and the irradiation time is not less than ten minutes.

In some embodiments, in the irradiation process, the light of the first wavelength is visible light having a wavelength ranging from 450 nm to 780 nm. Specifically, when the first wavelength is 450 nm to 600 nm, the conversion from the photosensitive polymerizable compound into the hydrophobic polymerizable compound has the highest efficiency. The duration of the conversion of the hydrophilic polymerizable compound is very short, basically less than 1 s, such as 0.2 s, 0.4 s, 0.6 s, 0.8 s, or 1 s. In order to obtain a better and stable conversion effect, and improve the operating efficiency, the first wavelength of 450 nm light is used. Considering the influence of the irradiation with the first light, the irradiation time of the irradiation with the second light is not less than 20 minutes.

In step S203, the color resist layer after the irradiation is etched by using a half-tone dimmer mask, and the color resist block of the first color forms a red color resist block 141. In step S203, the color resist layer after the irradiation is etched by using a half-tone dimmer mask, and the color resist block of the second color forms a blue color resist block 142. In step S203, the color resist layer after the irradiation is etched by using three half-tone dimmer masks, and the color resist block of the first color forms a green color resist block 143. The height of the blue color resist block 142 is higher than that of the red color resist block 141 and that of the green color resist block 143. A pixel segment difference between the red color resist block 141, the blue color resist block 142, and the green color resist block 143 is less than 0.2 microns. A black matrix is formed between the red color resist block 141, the blue color resist block 142, and the green color resist block 143.

After the red color resist block 141, the blue color resist block 142, and the green color resist block 143 are formed, a planarization layer is coated on the color resist layer to prevent metal ions in the red color resist block 141, the blue color resist block 142, and the green color resist block 143 from diffusing into the display panel, causing adverse reactions. The planarization layer is generally made of a transparent insulating material, having a light transmittance of greater than 99% and a thickness of between 1 and 2 microns.

After the planarization layer is formed, a support pillar is coated on the planarization layer, and the support pillar adopts a photoresist containing a photosensitive polymerizable compound, which has a composition the same as the photoresist and a added ratio different from the photoresist. The support pillar plays a role of maintaining the thickness of the cell. On the color filter substrate formed with the planarization layer, a photoresist containing a photosensitive polymerizable compound is coated. In the stripping area, the color filter substrate is irradiated with light of the first wavelength, and in the non-stripping area, the color filter substrate is irradiated with light of the second wavelength. The light of the first wavelength and the light of the second wavelength are alternatively used for irradiation, to increase the stripping efficiency of the photoresist in the stripping area, and then the support pillar is etched by exposure and development to have a spherical shape or a cylindrical shape.

The present application provides a display device, which includes an array substrate and a color filter substrate that are disposed opposite to each other, and a liquid crystal layer is formed between the array substrate and the color filter substrate, wherein the color filter substrate includes: a substrate; a electrode layer provided on the substrate; a black matrix provided on a side of the electrode layer away from the substrate; a color resist layer provided on a side of the black matrix away from the substrate; a planarization layer provided on the side of the black matrix away from the substrate; and a support pillar formed on a side of the planarization layer away from the substrate; wherein, the photoresist forming the black matrix, the color resist layer, and the support pillar are all added with the photosensitive polymerizable compound, wherein under irradiation of light of a first wavelength, the photosensitive polymerizable compound behaves as a hydrophilic polymerizable compound, and under irradiation of light of a second wavelength, the photosensitive polymerizable compound behaves as a hydrophobic polymerizable compound.

In some embodiments, the light of the first wavelength is ultraviolet light with a wavelength ranging from 10 nm to 400 nm, and the light of the second wavelength is visible light with a wavelength ranging from 450 nm to 780 nm.

In some embodiments, the photoresist includes resin, pigment, dispersant, solvent, a photoinitiator, and the like. The resin is a high-molecular polymer, generally an alkaline soluble resin, and its molecular chain usually contains a certain amount of acid groups such as carboxyl groups to ensure that it can react and dissolve with an alkaline developer during the development process. The pigment is a key of the photoresist for showing color, and different photoresists use different pigments. Dispersants are generally divided into two types of high-molecular polymer dispersants and surfactant dispersants, which are used to adsorb on a surface of the pigment and make the pigment evenly distributed in the photoresist. Organic solvents are used to dissolve various polymers, and usually organic solvents with good coating properties such as triethylene glycol methyl ether and the like. The photoinitiator is sensitive to ultraviolet light or visible light, and after absorbing the photon energy, the photoinitiator forms an excited form to initiate a polymerization reaction of monomers and provide a functional group. The photoinitiator used in the present application is azobenzene, and under irradiation, its nitrogen-nitrogen double bond is distorted, such that the the molecular polarity and spatial conformation are converted due to cis-trans isomerization of the azobenzene, so as to trigger a reversible conversion in hydrophilicity/hydrophobicity of the surface of the resin, wherein its surface exhibits hydrophilic properties after 10 minutes of UV exposure, while the photoresist composition exhibits high hydrophobic properties after 20 minutes of further visible light exposure. In the present application, the photosensitive polymerizable compound reacts with the polymer to form a hydrophilic polymerizable compound or a hydrophobic polymerizable compound under different light irradiation conditions, thereby changing a contact angle between the polymer and the substrate, such that the hydrophobicity and hydrophilicity of the polymer are converted.

In some embodiments, the polymer resin is treated with 3-bromopropionic acid and triethylamine to introduce a carboxyl functional group onto its surface, then further modified with dopamine with antibacterial properties, and after that the dopamine hydroxy is used to be grafted with a photosensitive carboxy azophenyl element, followed by modified with 1H, 1H, 2H, 2H-perfluorooctyl trichlorosilane to obtain a photoresist with light responsiveness of low surface energy finally. Based on the reversible conversion in hydrophilicity/hydrophobicity of the azobenzene under ultraviolet light irradiation, the photosensitive polymerizable compound forms a hydrophilic polymerizable compound under ultraviolet light irradiation, and the the photosensitive polymerizable compound forms a hydrophobic polymerizable compound under visible light irradiation. In some embodiments, a mass ratio of the photosensitive polymerizable compound in the photoresist is 30% to 70%.

In some embodiments, the display panel further includes a frame glue connecting the color filter substrate and the array substrate. The frame glue adopts a photoresist containing the above-mentioned photosensitive polymerizable compound. In an adhesion area, the frame glue is irradiated with the light of the second wavelength in the adhesion area, while the frame glue is irradiated with the light of the first wavelength in a non-adhesion area. As such, the adhesion of the frame glue in the adhesion area is enhanced and the residue of the frame glue in the non-adhesion area is reduced.

The present application provides a photoresist and a display panel prepared therefrom. The photoresist is added with a photosensitive polymerizable compound, wherein under irradiation of light of a first wavelength, the photosensitive polymerizable compound behaves as a hydrophilic polymerizable compound, and under irradiation of light of a second wavelength, the photosensitive polymerizable compound behaves as a hydrophobic polymerizable compound. By providing different wavelengths of light to a stripping area and a non-stripping area of the photoresist of the display panel, wherein the photoresist may be the hydrophilic polymerizable compound in the stripping area and has a small force with the substrate, while the photoresist may be the hydrophilic polymerizable compound and has an increased force with the substrate makes, such that the photoresist is easier to be stripped off in the stripping area of the display panel, and difficult to be stripped off in the non-stripping area of the display panel, thereby increasing the stripping efficiency of the photoresist in the display panel process. In the above embodiments, the descriptions of each embodiment have their own emphasis. The parts that are not described in detail in an embodiment can be referred to the detailed descriptions in other embodiments above, which will not be repeated herein for brevity.

The photoresist and the display panel prepared using the photoresist according to the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A photoresist, added with a photosensitive polymerizable compound, wherein under irradiation of light of a first wavelength, the photosensitive polymerizable compound behaves as a hydrophilic polymerizable compound, and under irradiation of light of a second wavelength, the photosensitive polymerizable compound behaves as a hydrophobic polymerizable compound.

2. The photoresist according to claim 1, wherein the photosensitive polymerizable compound comprises azobenzene.

3. The photoresist according to claim 1, wherein the light of the first wavelength is ultraviolet light having a wavelength ranging from 10 nm to 400 nm.

4. The photoresist according to claim 1, wherein the light of the second wavelength is visible light having a wavelength ranging from 450 nm to 780 nm.

5. The photoresist according to claim 1, wherein the photoresist further comprises an organic resin.

6. The photoresist according to claim 5, wherein a molecular chain of the organic resin contains a carboxyl functional group.

7. The photoresist according to claim 1, wherein a mass ratio of the photosensitive polymerizable compound present in the photoresist is 30% to 70%.

8. A display panel, prepared using the photoresist according to claim 1.

9. The display panel according to claim 8, comprising a color filter substrate arranged opposite to an array substrate, and a liquid crystal cell disposed between the color filter substrate and the array substrate, wherein the color filter substrate and the array substrate are bonded to each other by a frame glue, and
wherein the color filter substrate comprises a black matrix, a color resist layer, and a support pillar, and at least one of the black matrix, the color resist layer, the support pillar, and the frame glue is prepared using the photoresist.

10. The display panel according to claim 8, comprising a color filter substrate arranged opposite to an array substrate, and a liquid crystal cell disposed between the color filter substrate and the array substrate, wherein the color filter substrate and the array substrate are bonded to each other by a frame glue, and
wherein the color filter substrate comprises a substrate, a black matrix, a planarization layer, a color filter, and a support pillar which are stacked, and the array substrate comprises a color resist layer, wherein at least one of the black matrix, the color resist layer, the support pillar, and the frame glue is prepared using the photoresist.

11. A display device, prepared using the photoresist according to claim 1, wherein the photoresist is added with the photosensitive polymerizable compound, under irradiation of light of a first wavelength, the photosensitive polymerizable compound behaves as a hydrophilic polymerizable compound, and under irradiation of light of a second wavelength, the photosensitive polymerizable compound behaves as a hydrophobic polymerizable compound.

12. The display device according to claim 11, wherein the photosensitive polymerizable compound comprises azobenzene.

13. The display device according to claim 11, wherein the light of the first wavelength is ultraviolet light having a wavelength ranging from 10 nanometers to 400 nanometers.

14. The display device according to claim 11, wherein the light of the second wavelength is visible light having a wavelength ranging from 450 nm to 780 nm.

15. The display device according to claim 11, wherein the photoresist further comprises an organic resin.

16. The display device according to claim 15, wherein a molecular chain of the organic resin contains a carboxyl functional group.

17. The display device according to claim 11, wherein a mass ratio of the photosensitive polymerizable compound present in the photoresist is 30% to 70%.

18. The display device according to claim 17, comprising a display panel prepared using the photoresist.

19. The display device according to claim 18, comprising a color filter substrate arranged opposite to an array substrate, and a liquid crystal cell disposed between the color filter substrate and the array substrate, wherein the color filter substrate and the array substrate are bonded to each other by a frame glue, and
wherein the color filter substrate comprises a black matrix, a color resist layer, and a support pillar, and at least one of the black matrix, the color resist layer, the support pillar, and the frame glue is prepared using the photoresist.

20. The display device according to claim 18, comprising a color filter substrate arranged opposite to an array substrate, and a liquid crystal cell disposed between the color filter substrate and the array substrate, wherein the color filter substrate and the array substrate are bonded to each other by a frame glue, and
wherein the color filter substrate comprises a substrate, a black matrix, a planarization layer, a color filter, and a support pillar which are stacked, and the array substrate comprises a color resist layer, wherein at least one of the black matrix, the color resist layer, the support pillar, and the frame glue is prepared using the photoresist.

* * * * *